United States Patent [19]

Harada

[11] Patent Number: 4,912,666

[45] Date of Patent: Mar. 27, 1990

[54] PSEUDO-RANDOM NOISE CODE GENERATING CIRCUIT

[75] Inventor: Masaaki Harada, Tokyo, Japan

[73] Assignee: Clarion Co., Ltd., Tokyo, Japan

[21] Appl. No.: 97,799

[22] Filed: Sep. 16, 1987

[30] Foreign Application Priority Data

Sep. 25, 1986 [JP] Japan .................................. 61-227356

[51] Int. Cl.⁴ .............................................. G06F 3/00
[52] U.S. Cl. .................................................. 364/717
[58] Field of Search ........................... 364/717; 380/46

[56] References Cited

U.S. PATENT DOCUMENTS

| | | | |
|---|---|---|---|
| 3,557,356 | 1/1971 | Balza et al. | 364/717 |
| 4,023,026 | 5/1977 | O'Farrell | 364/717 |
| 4,531,022 | 7/1985 | Pioli | 380/46 |
| 4,785,410 | 11/1988 | Hamatsu | 364/717 |

*Primary Examiner*—Gary V. Harkcom
*Assistant Examiner*—Long T. Nguyen
*Attorney, Agent, or Firm*—Flynn, Thiel, Boutell & Tanis

[57] ABSTRACT

A pseudo-random noise code generating circuit having a shift register constructed by a plurality of unit circuits, each of which consists of an AND gate, an exclusive logical sum gate, a steering gate, which sets initial values and changes over the shift register operation, and a flipflop constituting the shift register.

6 Claims, 6 Drawing Sheets

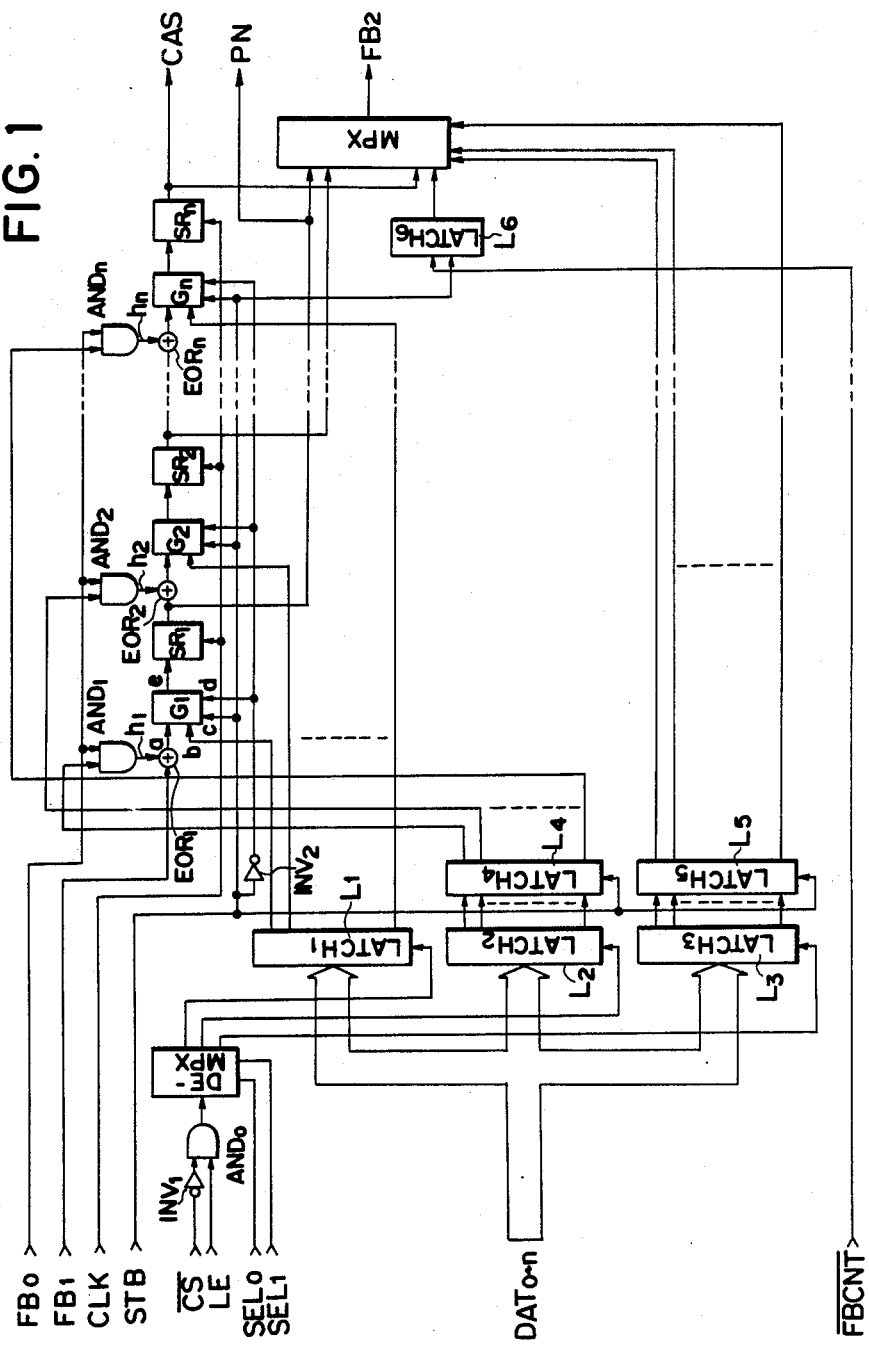

FIG. 2B
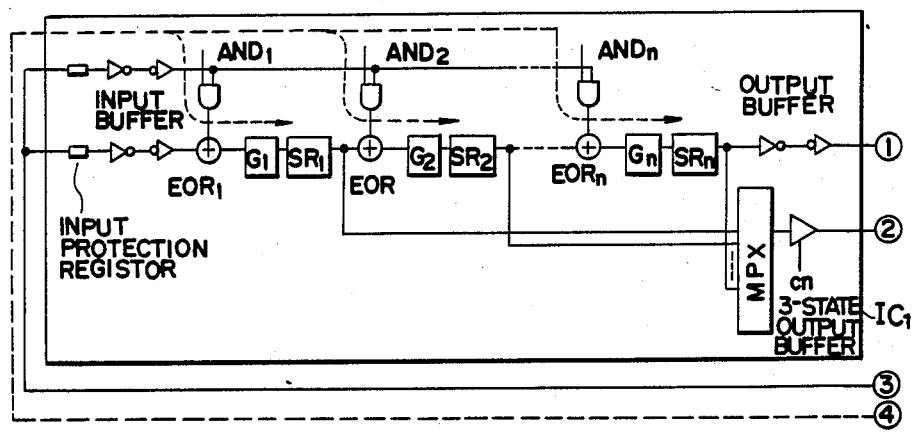
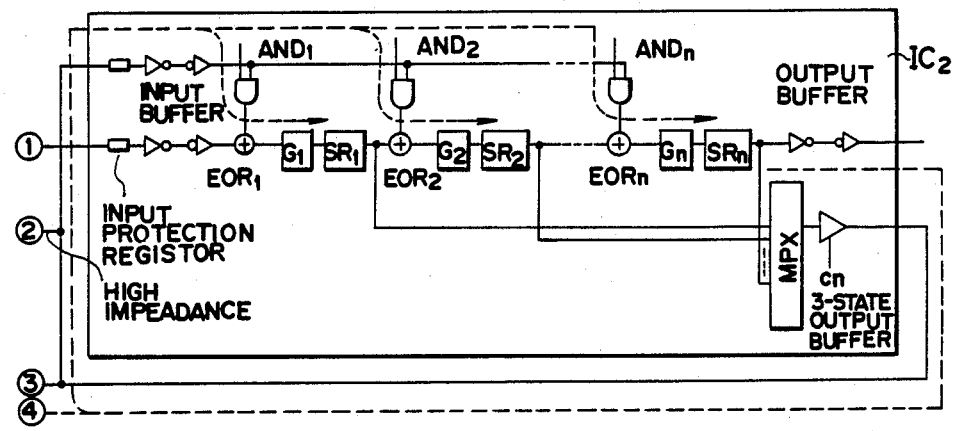
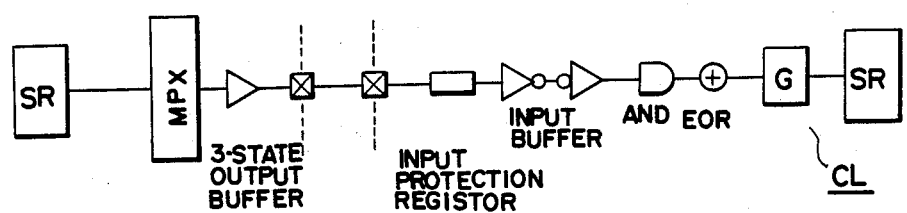

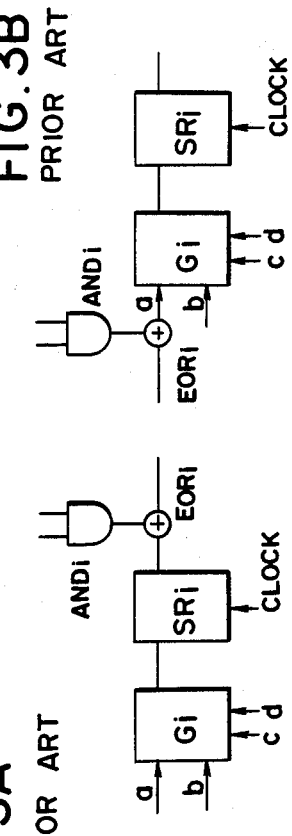
FIG. 3A PRIOR ART
FIG. 3B PRIOR ART
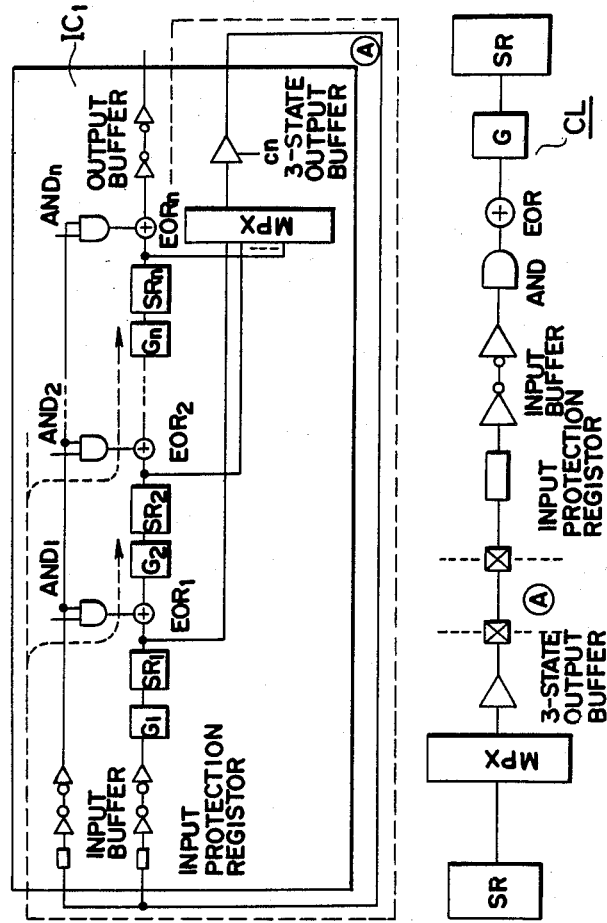
FIG. 5A PRIOR ART

FIG. 5B
PRIOR ART
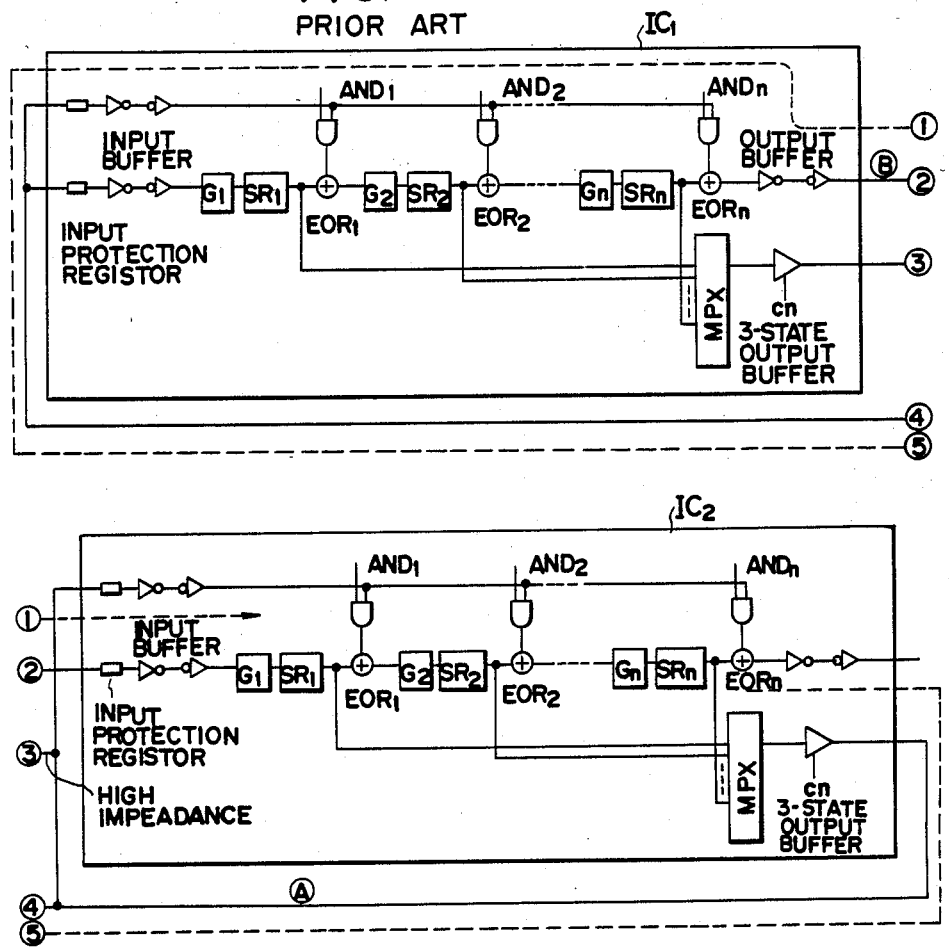
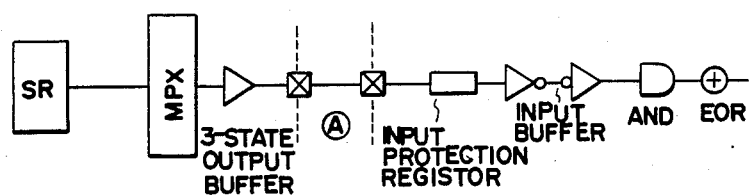
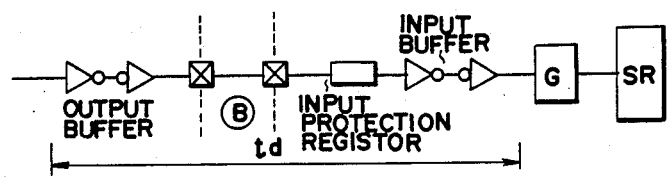

PSEUDO-RANDOM NOISE CODE GENERATING CIRCUIT

FIELD OF THE INVENTION

This invention relates to a circuit for generating pseudo-random noise codes of digital data.

BACKGROUND OF THE INVENTION

As a pseudo-random noise code generating circuit, by which it is possible to set codes and which is suitable for fabricating it in the form of an IC, there is known a circuit described e.g. in JP-A-No. 61-163088 and represented in FIG. 4. In FIG. 4 $G_1 \sim G_n$ represent steering gate circuits, which can be constructed by using NAND gates. $\oplus$ indicates an exclusive logical sum gate $EOR_1 \sim EOR_n$. $SR_1 \sim SR_n$ are flipflops; $AND_1 \sim AND_n$ are AND gates; $L_1 \sim L_6$ are latch circuits; MPX is a multiplexer; DE-MPX is a demultiplexer; $INV_1$ and $INV_2$ are inverters. As initial information necessary for the code generation by using a code generating device as indicated in FIG. 1 there are data determining each of the states (i)~(iii) as indicated below;
 (i) initial state of the flipflops;
 (ii) state of the feedback; and
 (iii) selection state of the last stage of the flipflops.

In FIG. 4 CLK represents a clock supplied to each of the flipflops $SR_1 \sim SR_n$; STB a strobe for code exchange given to the steering gate $G_1 \sim G_n$; and CS a chip selct signal; and LE a latch enable signal. DAT 0~n represent data (i)~(iii) as indicated above and are given to the latch circuits $L_1 \sim L_3$. The output of the latch circuits $L_1$ is given to each of the steering gates $G_1 \sim G_n$. The outputs of the latch circuits $L_2$ and $L_3$ are given to the AND circuits $AND_1 \sim AND_n$ and to the mutliplexer MPX through the latch circuits $L_4$ and $L_5$, respectively. SEL 0~1 are data selects and select data as indicated in TABLE 1. The latch circuits $L_1 \sim L_3$ are controlled by the output of the demultiplexer DE-MPX and the latch circuits $L_4$ and $L_5$ are controlled by STB described previously. FB 0~2 and CAS are outputs used for connecting the circuit indicated in FIG. 4 in cascade. FB 2 is the three state output and PN is the code (pseudo-random noise code) output.

TABLE 1

| SEL 1 | SEL 0 | Data |
|---|---|---|
| L | L | (i) |
| L | H | (ii) |
| H | L | (iii) |
| H | H | meaningless |

At first the operation, in the case where the circuit indicated in FIG. 4 is used alone, will be explained.

The feature of this system consists in that a desired long period code can be obtained easily by connecting a plurality of same circuits in cascade, when the circuit indicated in FIG. 4 is fabricated in the form of an IC.

However a circuit of this system fabricated in the form of an IC has a disadvantage that the highest working frequency is lowered by the cascade connection. FIGS. 5 (a) and (b) indicate the paths for which the transmission of signals takes the longest time in a prior art circuit fabricated in the form of an IC (hereinbelow called critical paths). FIG. 5 (a) indicates the critical path, in the case where the IC circuit described above is used alone and FIG. 5 (b) indicates same of an IC circuit $IC_1$, in which two IC circuits described above are connected in cascade. The critical path, in the case where more than two IC circuits are connected in cascade, is identical to (b). In either case the fundamental construction of the critical path CL is SR→multiplexer→3 state output buffer→AND gate→EOR gate→steering gate→SR. However, when they are connected in cascade, since the signal propagates two times (A) and (B) outside of the IC circuits $IC_1$ and $IC_2$, the critical path becomes long. Since a buffer, an input protection resistor, etc. are necessary for the purpose of increasing the driving capacity, working out a countermeasure against static electric breakdown, etc. for the propagation of the signal between different IC circuits, the delayed time is considerably increased (corresponding to td in FIG. 5 (b).

OBJECT OF THE INVENTION

The object of this invention is to provide a pseudo-random noise code generating circuit, which is suitable for fabricating it in the form of an IC, permitting to increase the working speed when a plurality of them are connected in cascade and to equalize the highest working frequency in the case where it is used alone with that in the case where they are used in cascade.

SUMMARY OF THE INVENTION

In order to achieve the above, object a pseudo-random noise code generating circuit according to this invention is characterized in that a unit of a shift register construction used therefor comprises an exclusive logical sum gate, an AND gate inputting a sum signal in the input of the exlcusive logical sum gate described above, a steering gate, in which the output of the exclusive logical sum gate is inputted and which sets the initial values and changes over the shift register operation, and a flipflop connected in series, following the steering gate described above.

FIGS. 3 (a) and (b) indicate the difference between the unit of the shift register construction used in the pseudo-random noise code generating circuit according to the prior art techniques and that according to this invention. In the figures $G_1$ is a steering gate setting the initial values and changing over the shift register operation; $SR_1$ is a flipflop constituting the shift register; and $EOR_1$ is an exclusive logical sum gate. In $G_1$ a is an output signal of the preceding unit of the shift register construction; b is a signal representing the initial value; c and d are control signal inputs for changing over the preceding two.

As it is obvious, when FIGS. 3 (a) and (b) are compared with each other, in the unit of the shift register construction, according to this invention, the position of $G_1$ and $SR_1$ and that of $AND_1$ and $EOR_1$ are exchnaged with respect to those according to the prior art techniques.

BRIEF DESCRIPTION OF THE DRAWINGS

FIG. 1 is a block diagram illustrating the construction of a pseudo-random noise code generating circuit according to this invention;

FIGS. 3 (a) and (b) are schemes indicating the difference between the unit of the shift register construction according to the prior art techniques and that according to this invention;

FIGS. 5 (a) and (b) indicate critical paths of IC circuits according to the prior art techniques.

DETAILED DESCRIPTION

Figure 4:
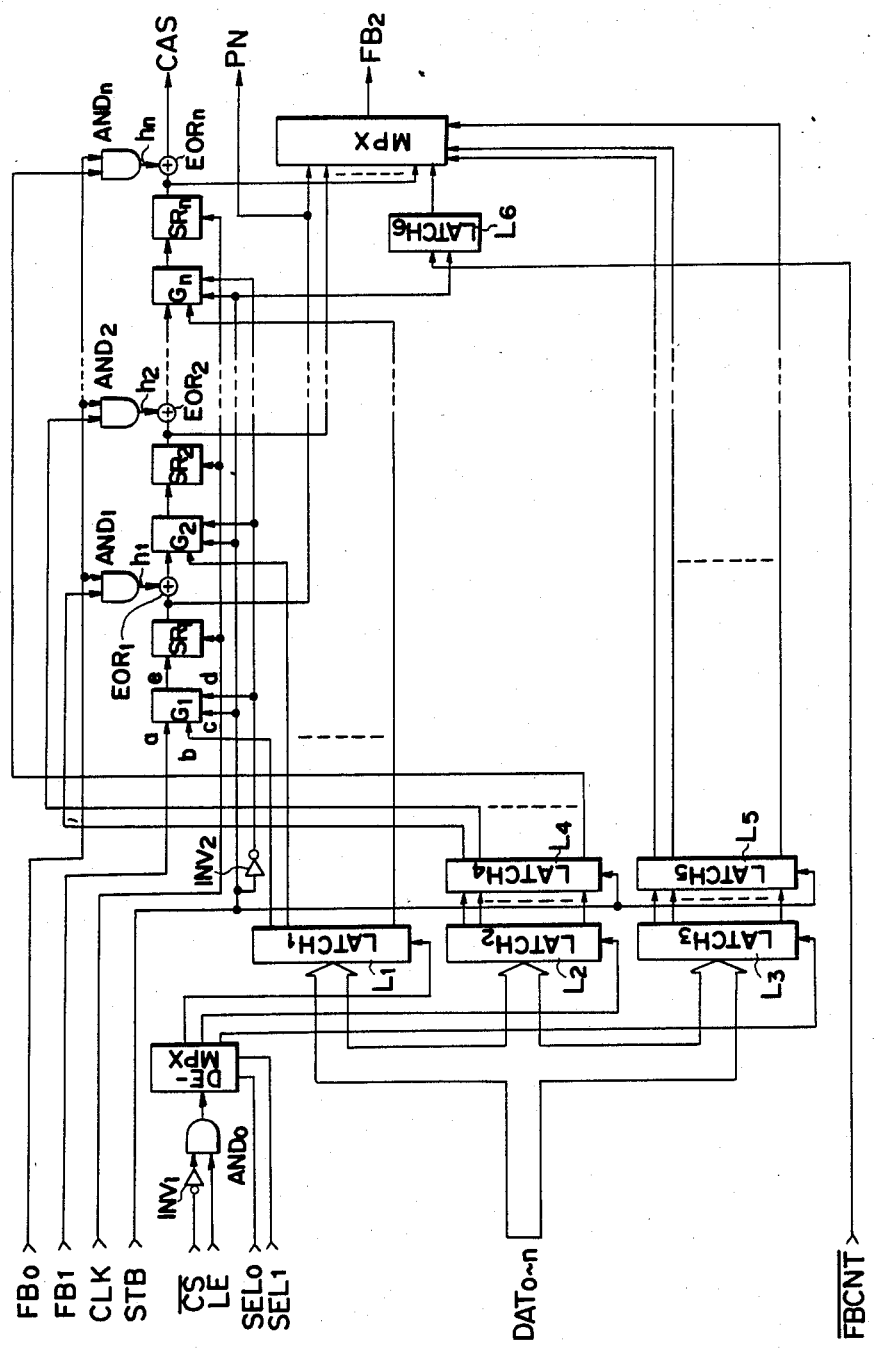
FIG. 4 is a block diagram ilustrating the construction of a pseudo-random noise code generating circuit according to the prior art techniques.

FIG. 1 is a block diagram illustrating the construction of a pseudo-random noise code generating circuit according to this invention, in which the symbols used in FIG. 4 in common represent items identical or similar to corresponding ones in FIG. 4.

Figure 2A:
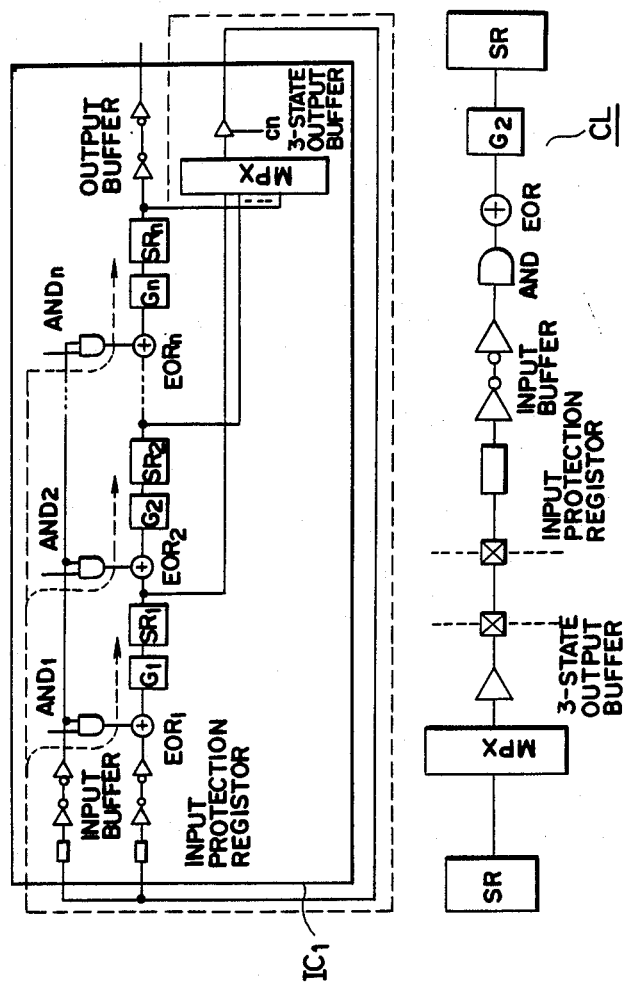
FIGS. 2 (a) and (b) indicate critical paths of IC circuits according to this invetnion.

FIGS. 2 (a) and (b) indicate the critical path of the IC circuit indicated in FIG. 1, when it is used alone, and that of two IC circuits $IC_1$ and $IC_2$ indicated in FIG. 1 and connected in series. The critical path, in the case where more than two IC circuits are connected in cascade, is identical to (b). According to the prior art techniques, since the exclusive logical sum gate determining the input of the first stage of the flipflops SR in the code generating circuit 2 indicated in FIG. 5 ($IC_2$) was connected with the last stage of the code generating circuit 1, the signal propagated outside of the IC circuits. On the contrary, according to this invention, since the exclusive logical sum gate described above is inside of the code generating circuit 2 ($IC_2$), it is not necessary that the signal propagates outside of the IC circuits. For this reason the critical path CL by the cascade connection is shortened (FIG. 2 (b)) and in addition it is equal to that in the case where the IC circuits are used separately. The path constituted by an in/output buffer, an input protection resistor, etc. has a relatively large delayed time due to the propagation, which is usually longer than 10 nsec because of influences of distortions in te waveform due to the package capacity, etc. Consequently it can be expected that not only the highest working frequency when it is used in the cascade connection is equal to that obtained when it is used alone, but also the delayed time by the cascade connection is shorter than 10 nsec.

As explained above, according to this invention, it is possible to attempt to improve the speed by the cascade connection of code generating circuits fabricated in the form of IC and to eliminate the difference between the highest working frequency when the circuit is used alone and that obtained when they are used by the cascade connection.

While particular embodiments of the invention have been shown and described, it will be obvious to those skilled in the art that various changes and modificatins may be made without departing from the present invention in its broader aspect.

The embodiments of the invention in which an exclusive property of privilege is claimed are defined as follows:

1. A pseudo-random noise code generating circuit comprising a shift register which includes a plurality of units, each having:
   (a) an exclusive logical sum gate having first and second inputs and having an output,
   (b) an AND gate having first and second inputs and having an output connected to said second input of said exclusive logical sum gate,
   (c) a steering gate having first and second inputs, an output, and a control input, said steering gate coupling one of its first and second inputs selected by its control input to its output, said first input of said steering gate being coupled to said output of said exclusive logical sum gate, and
   (d) a flipflop having a data input connected to said output of said steering gate, having a clock input, and having an output;
   said circuit including a first cascade input terminal coupled to said second input of each said AND gate; said circuit including a second cascade input terminal coupled to the first input of the exclusive logical sum gate of a first of said units; said circuit including a cascade output terminal and means for coupling the output of a selected one of said flipflops to said cascade output terminal, the flipflop of each said unit other than a second of said units having its output coupled to the first input of the exclusive logical sum gate of a respective one of said units other than said first of said units; said circuit including means for supplying a respective signal having a selected logical condition to said first input of each said AND gate; said circuit including means for supplying a clock signal to said clock input of each said flipflop; said circuit including means for supplying to said second input of each of said steering gates a respective initial value signal; and said circuit including means for supplying a control signal to siad control input of each said steering gate.

2. A circuit of claim 1, wherein said means for coupling the output of said selected one of said flipflops to said cascade output terminal includes a multiplexer having a plurality of data inputs which are each coupled to the output of a respective one of said flipflops, having a data output which is coupled to said cascade output terminal, and having select inputs which select one of said data inputs thereof to be coupled by said multiplexer to its data output; and includes means for supplying a select signal to each of said select inputs of said multiplexer.

3. A circuit of claim 2, including a further cascade output terminal which is coupled to the output of said flipflop of said second of said units.

4. A pseudo-random generator circuit comprising: first and second cascade input terminals; a cascade output terminal; a first flipflop and a plurality of second flipflops, said first and second flipflops each having a data input, a data output and a clock input; means for supplying a clock signal to saidclock input of each of said first and second flipflops; means for applying to said cascade output terminal a signal present at the data output of said first flipflop; a first exclusive logic sum gate and a plurality of second exclusive logic sum gates, said first and second exclusive logic sum gates each having first and second inputs and having an output coupled to the data input of a respective one of said first and second flipflops, said first exclusive logic sum gate having its first input coupled to said second cascade input terminal, and the data output of each of said second flipflops being coupled to the first input of a respective one of said second exclusive logic sum gates, and gating means coupled to said first cascade input terminal for applying to said second input of each of said first and second exclusive logic sum gates a respective logic signal.

5. A circuit of claim 4, including a further cascade output terminal; and incuding a multiplexer having a plurality of data inputs which are each coupled to the output of a respective one of said flipflops, having a data output which is couplted to said further cascade output terminal, and having select inputs which select one of the data inputs thereof to be coupled by said multiplexer to its data output, and including means for supplying a respective select signal to each of said select inputs of said multiplexer.

6. A circuit of claim 5, wherein said gating means includes a plurality of AND gates each having first and second inputs and having an output coupled to the second input of a respective one of said exclusive logic sum gates, said second input of each of said AND gates being coupled to said first cascade input terminal, and said circuit including means for applying to said first input of each of said AND gates a respective signal having a selected logical condition.

* * * * *